United States Patent
Tsai et al.

(10) Patent No.: US 12,057,846 B2
(45) Date of Patent: Aug. 6, 2024

(54) DELAY LOCK LOOP CIRCUITS AND METHODS FOR OPERATING SAME

(71) Applicant: Taiwan Semiconductor Manufacturing Company, Ltd., Hsinchu (TW)

(72) Inventors: Tsung-Hsien Tsai, Taoyuan County (TW); Ya-Tin Chang, Hsinchu (TW); Ruey-Bin Sheen, Taichung (TW); Chih-Hsien Chang, New Taipei (TW); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/301,299

(22) Filed: Apr. 17, 2023

(65) Prior Publication Data

US 2023/0253970 A1  Aug. 10, 2023

Related U.S. Application Data

(63) Continuation of application No. 17/955,615, filed on Sep. 29, 2022, now Pat. No. 11,664,808, which is a
(Continued)

(51) Int. Cl.
*H03L 7/081* (2006.01)
*H03L 7/095* (2006.01)

(52) U.S. Cl.
CPC .......... *H03L 7/0814* (2013.01); *H03L 7/0818* (2013.01); *H03L 7/095* (2013.01)

(58) Field of Classification Search
CPC ...... H03L 7/0814; H03L 7/0818; H03L 7/095
See application file for complete search history.

(56) References Cited

U.S. PATENT DOCUMENTS 4,718,036 A * 1/1988 Halbert .............. G01R 31/2834
375/247
5,990,713 A * 11/1999 Zepp ..................... H03L 7/0994
327/158
(Continued)

FOREIGN PATENT DOCUMENTS

CN  114726353  7/2022
CN  114726353 A  *  7/2022  ........... H03L 7/0814
(Continued)

OTHER PUBLICATIONS

Taiwan Office Action, Application No. 110109600, Dated Apr. 13, 2023.

*Primary Examiner* — Adam D Houston
(74) *Attorney, Agent, or Firm* — Jones Day

(57) ABSTRACT

Digital delay lock circuits and methods for operating digital delay lock circuits are provided. A phase detector is configured to receive first and second clock signals and generate a digital signal indicating a relationship between a phase of the first clock signal and a phase of the second clock signal. A phase accumulator circuit is configured to receive the digital signal and generate a phase signal based on values of the digital signal over multiple clock cycles. A decoder is configured to receive the phase signal and generate a digital control word based on the phase signal. A delay element is configured to receive the digital control word. The delay element is further configured to change the relationship between the phase of the first clock signal and the phase of the second clock signal by modifying the phase of the second clock signal according to the digital control word.

20 Claims, 12 Drawing Sheets

Related U.S. Application Data continuation of application No. 17/531,927, filed on Nov. 22, 2021, now Pat. No. 11,489,530, which is a continuation of application No. 17/141,276, filed on Jan. 5, 2021, now Pat. No. 11,211,936.

(56) References Cited

U.S. PATENT DOCUMENTS

| | | | | |
|---|---|---|---|---|
| 8,284,886 | B2* | 10/2012 | Staszewski | G01R 31/2822 |
| | | | | 455/260 |
| 9,362,928 | B1* | 6/2016 | Goyal | H03L 7/0814 |
| 10,784,872 | B1* | 9/2020 | Tsai | H03L 7/087 |
| 11,211,936 | B1* | 12/2021 | Tsai | H03L 7/095 |
| 2002/0008551 | A1* | 1/2002 | Sevalia | H03L 7/081 |
| | | | | 327/105 |
| 2002/0071509 | A1* | 6/2002 | Richards | G01S 13/0209 |
| | | | | 375/355 |
| 2006/0091967 | A1* | 5/2006 | Iozsef | H03K 17/04106 |
| | | | | 331/57 |
| 2007/0085579 | A1* | 4/2007 | Wallberg | H03L 7/08 |
| | | | | 375/376 |
| 2010/0156489 | A1 | 6/2010 | Miyano | |
| 2011/0133794 | A1* | 6/2011 | Dunworth | H03L 7/093 |
| | | | | 327/156 |
| 2011/0248752 | A1* | 10/2011 | Willey | H03L 7/0816 |
| | | | | 327/158 |
| 2013/0076413 | A1* | 3/2013 | Uemura | H03L 7/0818 |
| | | | | 327/156 |
| 2013/0229214 | A1* | 9/2013 | Ichida | G11C 7/1039 |
| | | | | 327/158 |
| 2014/0015573 | A1 | 1/2014 | Ross et al. | |
| 2014/0368242 | A1* | 12/2014 | Unruh | H03L 7/1077 |
| | | | | 327/295 |
| 2015/0236708 | A1* | 8/2015 | Ma | H03L 7/193 |
| | | | | 327/156 |
| 2016/0006421 | A1* | 1/2016 | Saric | H03K 3/0315 |
| | | | | 375/327 |
| 2016/0056827 | A1* | 2/2016 | Vlachogiannakis | G04F 10/005 |
| | | | | 327/158 |
| 2016/0118990 | A1* | 4/2016 | Faisal | H03L 7/0997 |
| | | | | 327/156 |
| 2022/0216876 | A1* | 7/2022 | Tsai | H03L 7/095 |
| 2023/0016886 | A1* | 1/2023 | Tsai | H03L 7/0818 |
| 2023/0253970 | A1* | 8/2023 | Tsai | H03L 7/0814 |
| | | | | 327/158 |

FOREIGN PATENT DOCUMENTS

| | | | | |
|---|---|---|---|---|
| KR | 20240021038 A | * | 2/2024 | |
| TW | 200921322 | | 5/2009 | |
| TW | 201308910 | | 2/2013 | |
| WO | WO-03063435 A1 | * | 7/2003 | H03K 7/04 |

* cited by examiner

DELAY LOCK LOOP CIRCUITS AND METHODS FOR OPERATING SAME

CROSS-REFERENCE TO RELATED APPLICATIONS

This application is a continuation application of U.S. patent application Ser. No. 17/955,615, filed Sep. 29, 2022, which is a continuation application of U.S. patent application Ser. No. 17/531,927, filed Nov. 22, 2021, which is a continuation application of U.S. patent application Ser. No. 17/141,276, filed Jan. 5, 2021, each of which is incorporated herein by reference in their entirety.

BACKGROUND

Delay lock loop circuits are often included in digital systems, such as memory systems, and used to align edges of multiple digital signals. For example, a delay lock loop circuit may be used to align a rising edge and/or falling edge of a clock signal based upon a reference clock signal to produce a synchronized output clock signal.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
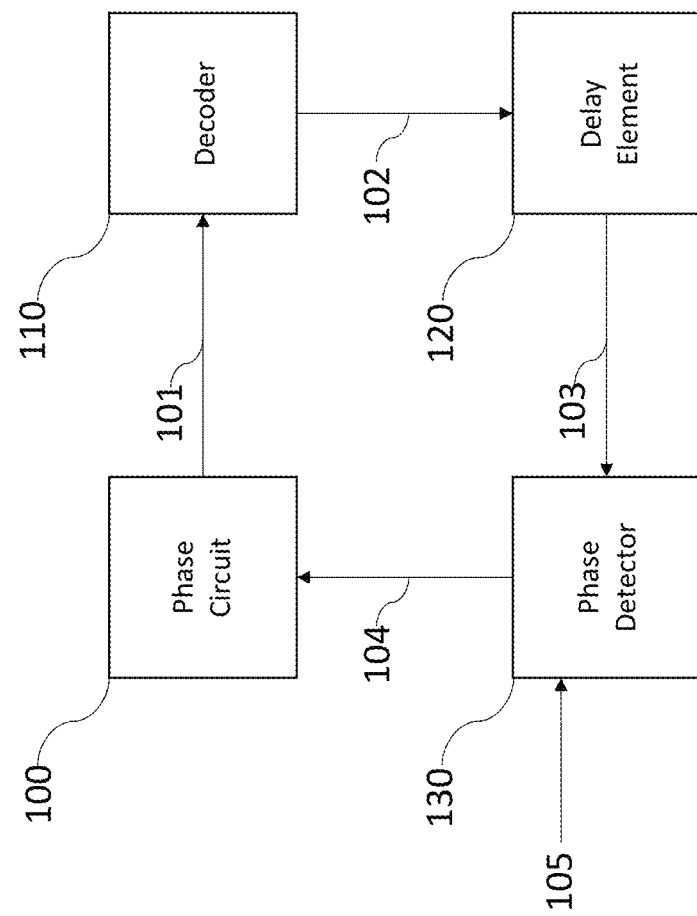
FIG. 1 is a block diagram of a delay lock loop (DLL) circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Delay lock loop (DLL) circuits are used in digital systems to align the edges of a plurality of digital signals. A DLL circuit may be used, for instance, to align a rising edge and/or falling edge of a clock signal based upon a reference clock signal to produce a synchronized output clock signal. Conventional DLL circuits are implemented via analog circuitry and typically include a phase detector, a charge pump, a filter, and a delay train. Such conventional DLL circuits have the disadvantage of being susceptible to unwanted latencies introduced between a reference clock signal and the output clock signal. The unwanted latencies can be a result of characteristics inherent to analog circuits, including current mismatches caused by environmental factors (e.g., exposure to heat, etc.). These latencies may become particularly pronounced at higher frequencies (e.g., frequencies of 7 GHz or higher) and when smaller feature sizes (e.g., 5 nm feature size, etc.) are used.

The approaches of the instant disclosure provide DLL circuits and methods for operating DLL circuits that eliminate or mitigate the unwanted latencies and other deficiencies of the conventional DLL circuits. In some embodiments, the approaches of the instant disclosure achieve these advantages by controlling the DLL circuit using digital technology. The digitally controlled DLL circuits of the instant disclosure are less susceptible to error being introduced into the output and distortion of the targeted phase delay between the reference clock signal and the output clock signal. The approaches of the instant disclosure therefore enable a higher degree of accuracy, predictability, resiliency, and reliability than conventional analog DLL approaches. Additionally, the mitigation of error through the use of digitally controlled DLL circuits enables their use in high frequency applications and in implementations with small feature sizes.

FIG. 1 is a block diagram of a DLL circuit, in accordance with some embodiments. As seen in this figure, the DLL circuit includes a phase detector 130 that receives a first clock signal 105 and a second clock signal 103. Based on the received clock signals, the phase detector 130 generates a digital signal 104 that indicates a relationship between a phase of the first clock signal 105 and a phase of the second clock signal 103. The phase detector 130 is configured to compare the first clock signal 105 and the second clock signal 103 to determine a difference in relative phases between the two signals. In some embodiments, the first clock signal 105 is a reference clock signal received by the DLL circuit, and the second clock signal 103 is an output clock signal generated by the DLL circuit. The DLL circuit of FIG. 1 may be configured to align an edge (e.g., a rising edge and/or falling edge) of the second clock signal 103 with an edge of the first clock signal 105 to produce a synchronized output clock signal.

The digital signal 104 generated by the phase detector 130 is received by a phase circuit 100. In some embodiments, the phase circuit 100 is a phase accumulator circuit that generates a phase signal 101 based on the received digital signal 104. In such embodiments, the phase circuit 100 is configured to accumulate values of the digital signal 104 over multiple cycles to compute a total phase shift delay needed to align the phases of the first clock signal 105 and second clock signal 103. This information is output by the phase circuit 100 as the phase signal 101.

In some embodiments, the digital signal 104 received by the phase circuit 100 includes digital values (e.g., logic-level high values of "1," logic-level low values of "0") that indicate whether the second clock signal 103 lags or leads the first clock signal 105. For instance, in some embodiments, the digital signal 104 having a value of "1" indicates that the second clock signal 103 lags behind the first clock signal 105, and the digital signal 104 having a value of "0" indicates that the second clock signal 103 leads the first clock signal 105, or vice versa.

In some embodiments, the phase circuit 100 increases a value of the phase signal 101 based on the digital signal 104 having a first value (e.g., a logic-level high value of "1"), and decreases the value of the phase signal 101 based on the digital signal 104 having a second value (e.g., a logic-level low value of "0"). The phase signal 101 generated by the phase circuit 100 is received by a decoder 110, which generates a digital control word 102 based on the phase signal 101. In some embodiments, the decoder 110 performs one or more decoding functions to decode the phase signal 101 and thereby generate the digital control word 102.

A delay element 120 receives the digital control word 102 from the decoder 110. In some embodiments, the delay element 120 is configured to change the relationship between the phase of the first clock signal 105 and the phase of the second clock signal 103 by modifying the phase of the second clock signal 103 according to the digital control word 102. The phase shifted signal is then output by the delay element 120 as the second control signal 103, which is fed back to the phase detector 130 as feedback to repeat the above-described process.

As is further explained below with reference to FIGS. 2-10, embodiments of the instant disclosure utilize an approach that combines digital and analog circuitry to improve upon conventional analog DLL circuits. In some embodiments, the digital circuitry includes the phase circuit 100 and decoder 110, which together make up parts of a digital core of the DLL circuit. Digital signals used under the approaches of the instant disclosure include the aforementioned digital signal 104 generated by the phase detector 130 and the digital control word 102 generated by the decoder 110. The use of such digital components and digital signals enables improvements over the conventional DLL circuits, which are based primarily in analog technology. Such improvements are described throughout this disclosure. The structure and functionality of the components making up the digital core are described in further detail below.

Along with the digital core, DLL circuits of the instant disclosure include analog components that interact with the digital components. These analog components include the delay element 120 and the phase detector 130, which together make up parts of an analog core of the DLL circuit. The structure and functionality of the components making up the analog core are described in further detail below. The combination of analog and digital components described herein are used to provide DLL circuits and methods for operating DLL circuits that advantageously eliminate unwanted latencies and errors of the conventional analog DLL circuits.

Figure 2:
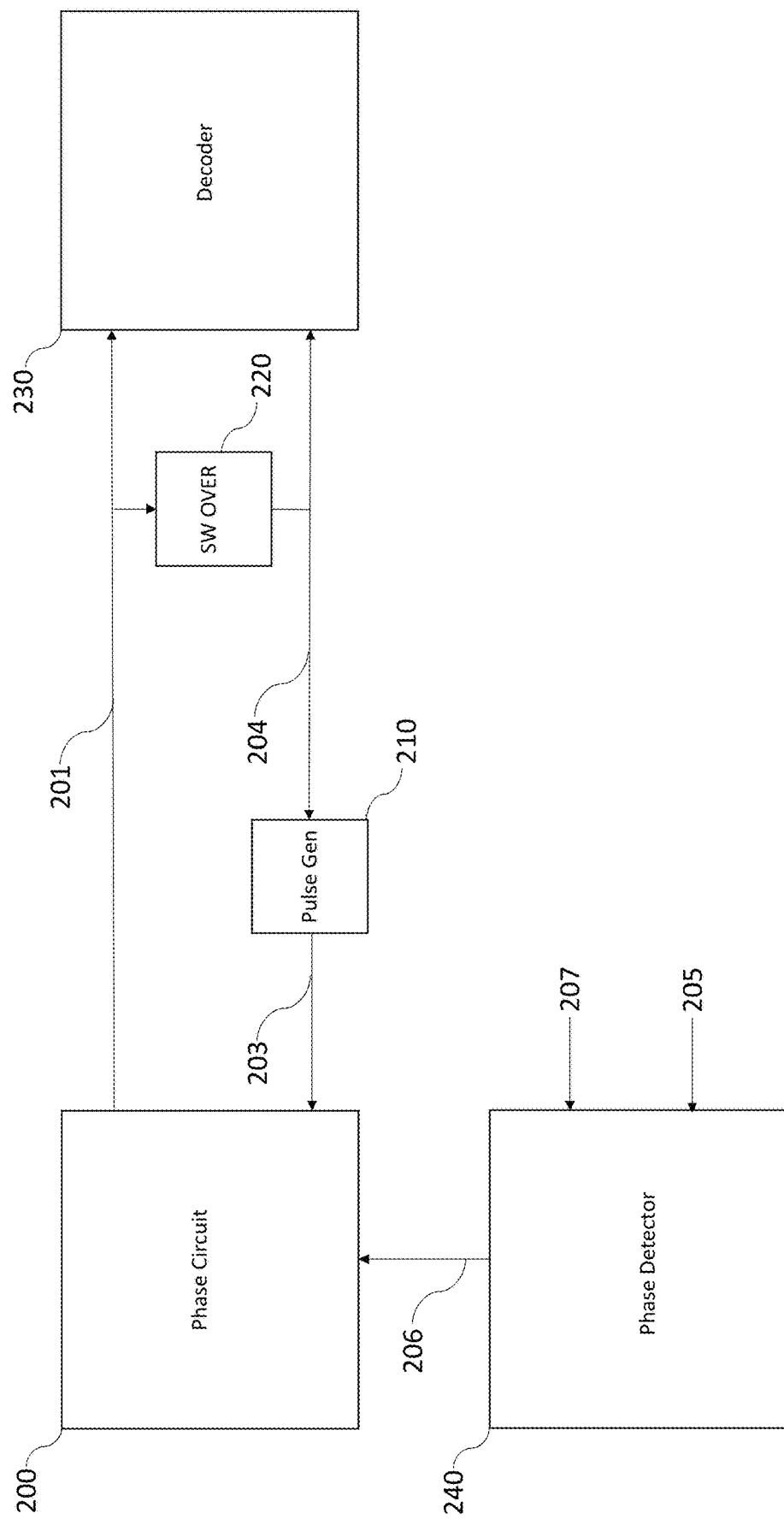
FIG. 2 is a block diagram showing signals that are exchanged between a phase circuit and a decoder, in accordance with some embodiments.

FIG. 2 is a block diagram depicting signals that are exchanged between a phase circuit 200 and a decoder 230, in accordance with some embodiments. The phase circuit 200, decoder 230, and phase detector 240 provide the functionality described above with respect to the phase circuit 100, decoder 110, and phase detector 130, respectively, of FIG. 1. As described herein, some embodiments of the instant disclosure include delay elements (e.g., delay element 120 of FIG. 1, delay element 410 of FIG. 4, etc.) that provide delays based on both fine and coarse tuning modes. In some embodiments, the fine tuning and coarse tuning modes are achieved using distinct delay control words that are generated by different parts of the decoder 230. FIG. 2 depicts aspects of a control mechanism for selecting and switching between fine tuning and coarse tuning modes.

More specifically, in some embodiments, a switch between the coarse tuning mode and the fine tuning mode occurs automatically after a phase difference to be achieved is of a precision that cannot be achieved by the coarse tuning mode of the delay element. This event is detected by a phase detector 240, which outputs a digital signal 206 having a first logic value (e.g., a logic-level high value of "1"), indicating a need for additional phase shift to be applied to the second clock signal 207. The digital signal 206 and the second clock signal 207 correspond to the digital signal 104 and the second clock signal 103, respectively, as described above with respect to FIG. 1. The phase detector 240 outputs the digital signal 206 having the first logic value until the phase of second clock signal 207 has been delay shifted past a target phase, indicating that the phases of the first clock signal 205 and the second clock signal 207 are aligned to a degree smaller than the amount of delay that can be provided by the coarse tuning mode of the delay element. At this point, the phase detector 240 generates the digital signal 206 having a second logic value (e.g., a logic-level low value of "0"), indicating the need to switch to the fine tuning mode to further align the phases of the signals 205, 207.

The phase circuit 200 receives the digital signal 206 from the phase detector 240 and generates a phase signal 201 based on the received signal 206. The phase signal 201 corresponds to the phase signal 101 of FIG. 1 and provides the same or similar functionality as described above for that signal. In some embodiments, the phase circuit 200 is configured to increase a digital number output of the phase signal 201 by one bit for each clock cycle in which it receives the digital signal 206 having the first logic value (e.g., the logic-level high value of "1"), thus increasing the total delay to be applied to the second clock signal 207.

When the phase circuit 200 receives the digital signal 206 having the second logic value (e.g., a logic-level low value of "0"), this indicates that a phase of the second clock signal 207 was delay shifted past a target phase in the previous cycle. Based on this input, the phase circuit 200 decreases the digital number output of the phase signal 201 by one bit, which causes the coarse tuning mode of the delay element (e.g., delay element 120 of FIG. 1, delay element 410 of FIG. 4, etc.) to delay the clock signal 207 such that its phase is aligned as close as possible to the target phase as the coarse tuning mode can allow without having the clock signal 207 lag the target phase.

In some embodiments, a mode switching element 220 is configured to receive phase signal 201. Upon detecting a decrease in the value of the phase signal 201, the mode switching element 220 changes a value of a mode-switching signal 204 from a first logic-level value (e.g., "0") to a second logic-level value (e.g., "1"). The decoder 230 is configured to receive the phase signal 201 and the mode switching signal 204. When the mode switching signal 204 changes from the first logic-level value to the second logic-level value, the decoder 230 freezes the current value of phase signal 201 and initiates a fine decoding mode of the decoder 230.

In some embodiments, a pulse generator 210 is also configured to receive the mode switching signal 204. Upon receiving the mode switching signal 204 having the second logic-level value (e.g., "1"), the pulse generator 210 outputs a reset pulse on a reset accumulator signal 203, which is received by the phase circuit 200. Upon receipt of the reset accumulator signal 203, the phase circuit 200 is reset, which resets the phase signal 201 to an initial value (e.g., zero). The resetting of the phase signal 201 is performed such that the phase signal 201 can then be used to calculate a phase delay to be applied in the fine tuning mode of the delay element.

Figure 3:
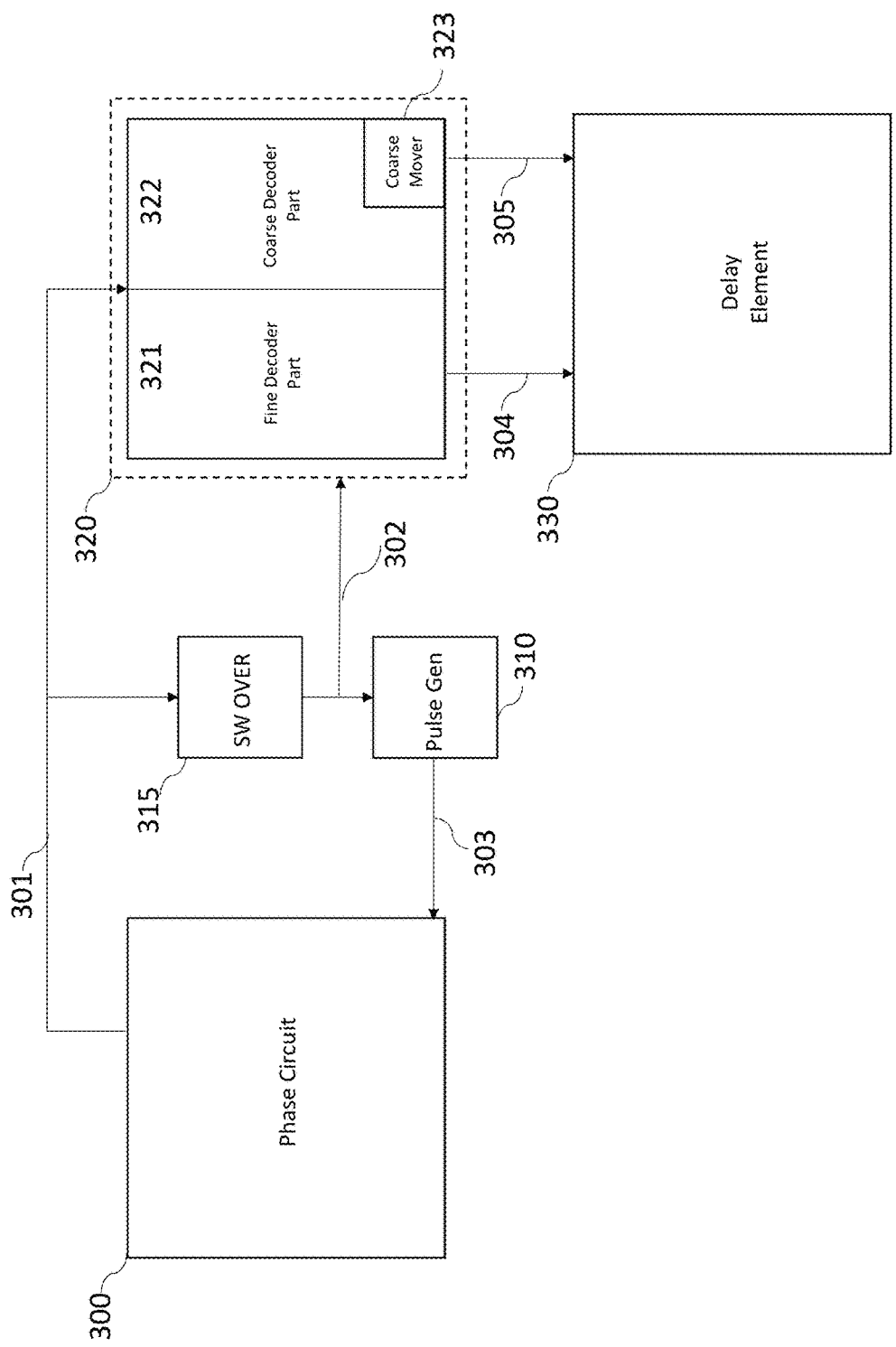
FIG. 3 is a block diagram depicting details of a decoder, in accordance with some embodiments.

FIG. 3 is a block diagram depicting additional details of a decoder 320, in accordance with some embodiments. The phase circuit 300, pulse generator 310, mode switching element 315, decoder 320, and delay element 330 of FIG. 3 provide some or all of the functionalities described above with respect to corresponding elements of FIGS. 1 and 2. Likewise, phase signal 301, mode-switching signal 302, and reset accumulator signal 303 of FIG. 3 are used in manners similar to the corresponding signals described above with reference to FIGS. 1 and 2.

In some embodiments, the decoder 320 contains a fine decoder part 321 and a coarse decoder part 322. As in FIG. 2, the decoder 320 is configured to receive the phase signal 301 and the mode-switching signal 302, which may be initialized to a first value (e.g., "0"). While the mode switching signal 302 has the first value, the coarse decoder part 322 is active, and the fine decoder part 321 is inactive. While active, the coarse decoder part 322 is configured to receive the phase signal 301 and convert it from a binary value to a corresponding unary coarse delay control word 305 to control an amount of delay to be applied by the delay element 330. In some embodiments, the coarse delay control word 305 is a 32-bit unary number, which is initialized to a first value (e.g., "0"). Before being converted to unary, a binary number equivalent to phase signal 301 is fed through a coarse mover 323, which is configured to continually output the last non-zero binary number it has received. In some embodiments, the coarse mover 323 is built into the decoder 320 to protect from variations in temperature and voltage.

In some embodiments, when the mode-switching signal 302 changes from the first value (e.g., "0") to a second value (e.g., "1"), the decoder 320 receives this second value. Based on the received second value, the decoder 320 locks the coarse decoder part 322 and activates the fine decoder part 321. Locking the coarse decoder part 322 prevents the phase signal 301 from entering the coarse decoder part 322, causing a specific value (e.g., "0") to propagate to the input of the coarse mover 323. The coarse mover 323 continues to output a binary number equivalent to the phase signal 301 it received so that the coarse tuning part of delay element 330 continues apply the same amount of delay. When the fine decoder part 321 of the decoder 320 is activated, it receives the phase signal 301 as an input and outputs a fine delay control word 304. In some embodiments, the fine delay control word 304 corresponds to the unary value of the phase signal 301 plus its initialized value equivalent to half of the maximum delay output of the fine tuning part of delay element 330. The fine delay control word 304 is a 32-bit unary number in some embodiments.

Figure 4:
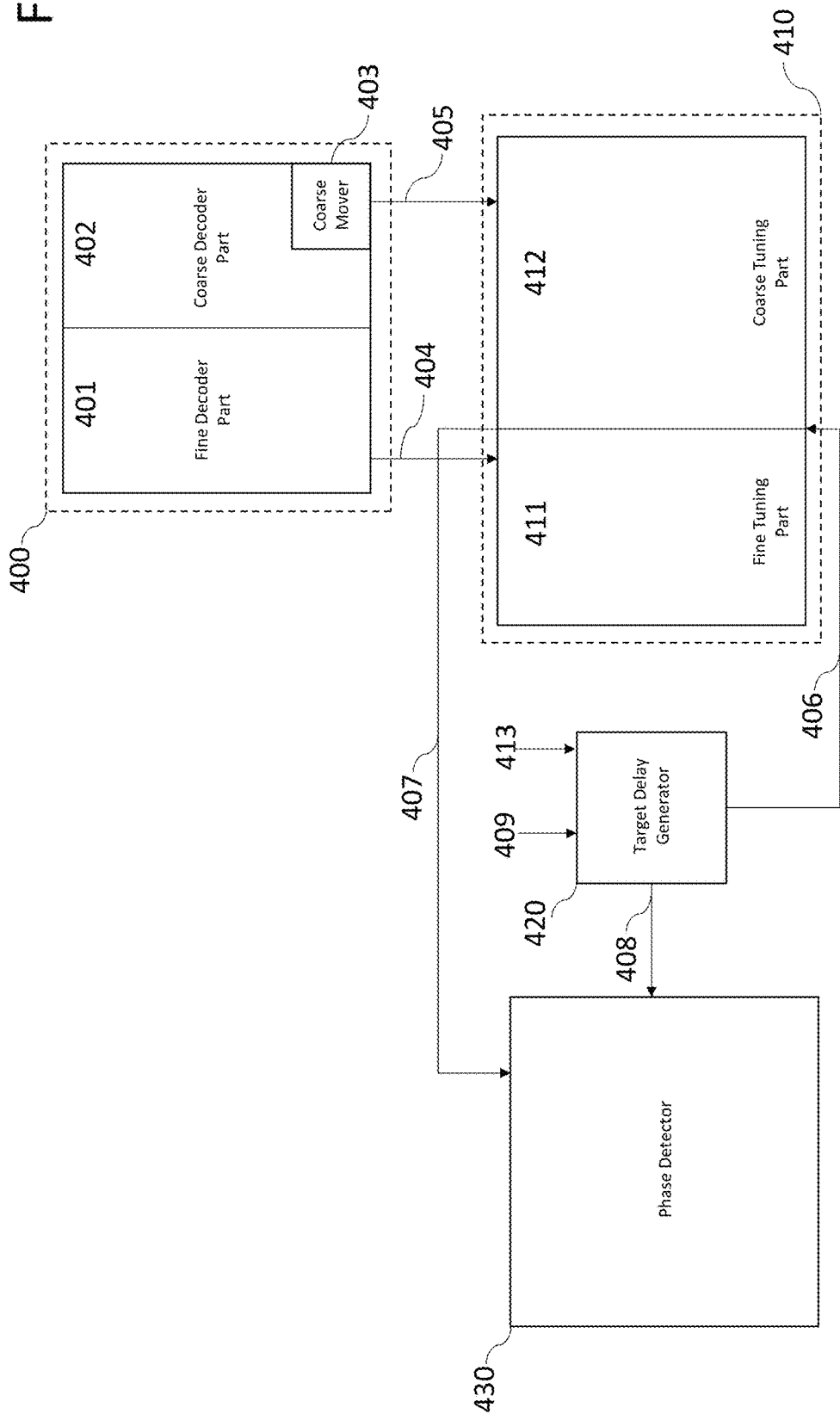
FIG. 4 is a block diagram depicting details of a delay element, in accordance with some embodiments.

FIG. 4 is a block diagram depicting details of a delay element 410, in accordance with some embodiments. The decoder 400, fine decoder part 401, coarse decoder part 402, coarse mover 403, delay element 410, and phase detector 430 of FIG. 4 provide some or all of the functionalities described above with respect to corresponding elements of FIGS. 1-3. Likewise, the fine delay control word 404, coarse delay control word 405, and second clock signal 407 of FIG. 4 are used in manners similar to the corresponding signals described above with reference to FIGS. 1-3.

In some embodiments, the delay element 410 is configured to accept unary inputs of the coarse delay control word 405 and the fine delay control word 404, as well as a pre-shifted periodic signal 406. The unary coarse delay control word 405 is accepted by a coarse tuning part 412 of the delay element 410, which activates a number of coarse delay elements in coarse tuning part 412 corresponding to the unary coarse delay control word 405. Similarly, the unary fine delay control word 404 is accepted by a fine tuning part 411 of the delay element 410, which activates a number of fine delay elements in fine tuning part 411 corresponding to the unary fine delay control word 404. The delay element 410 then delays the pre-delayed periodic signal 406 by feeding it through the number of activated delay units of both the coarse tuning part 412 and fine tuning part 411, outputting a phase delay shifted version of the pre-shifted periodic signal 406 as the second clock signal 407.

As shown in FIG. 4, a target delay generator 420 is configured to accept a first clock signal 409 and a target delay signal 413. The first clock signal 409 corresponds to the first clock signal described above with reference to FIGS. 1-3 (e.g., first clock signal 105, first clock signal 205). In some embodiments, the target delay signal 413 is a periodic signal with a period size corresponding to a desired phase shift to be applied to first clock signal 409. The target delay generator 420 samples the first clock signal 409 at a rate equivalent to the inverse of the length of desired phase delay in some embodiments.

In embodiments where the target delay signal 413 is a periodic signal with a period size corresponding to the desired phase shift to be applied to a signal with the same frequency as first clock signal 409, this is accomplished by sampling input periodic signal 409 using the frequency of the target delay signal 413. This results in the target delay generator 420 outputting the pre-delayed periodic signal 406 in the resolution of the desired phase delay length and its period being a whole integer multiple of the desired phase delay. The target delay generator 420 also outputs a phase comparison signal 408. In some embodiments, the phase comparison signal 408 is created by running the sampled periodic signal equivalent to the pre-delayed signal 406 through an additional D flip flop with its clock being driven by the same periodic signal that was used to sample input periodic signal 409 to generate the pre-delayed periodic signal 406. This results in the phase comparison signal 408 also having a resolution of the desired phase delay and periods equal to a whole number integer multiple of the desired phase delay. However, because it has gone through an additional D-flip flop, the phase comparison signal 408 has a phase that lags a phase of the pre-delayed periodic signal 406 by exactly the length of one target phase delay.

The phase detector 430 is configured to accept the phase comparison signal 408 and the second clock signal 407, which is equivalent to the pre-delayed periodic signal 406 after it has been delay shifted by an amount of time that the delay element 410 has been programmed to execute. The phase detector 430 then compares these two signals to determine whether the amount of delay applied by the delay element 410 should be increased or decreased to bring the phases of the phase comparison signal 408 and the second clock signal 407 into alignment. Because the phase of the phase comparison signal 408 lags the pre-delayed periodic signal 406 by exactly the length of the target delay, a delay applied to the pre-delayed periodic signal 406 by delay element 410 that brings its phase into alignment with the phase of the phase comparison signal 408 must be equivalent to the target delay.

Figure 5A:
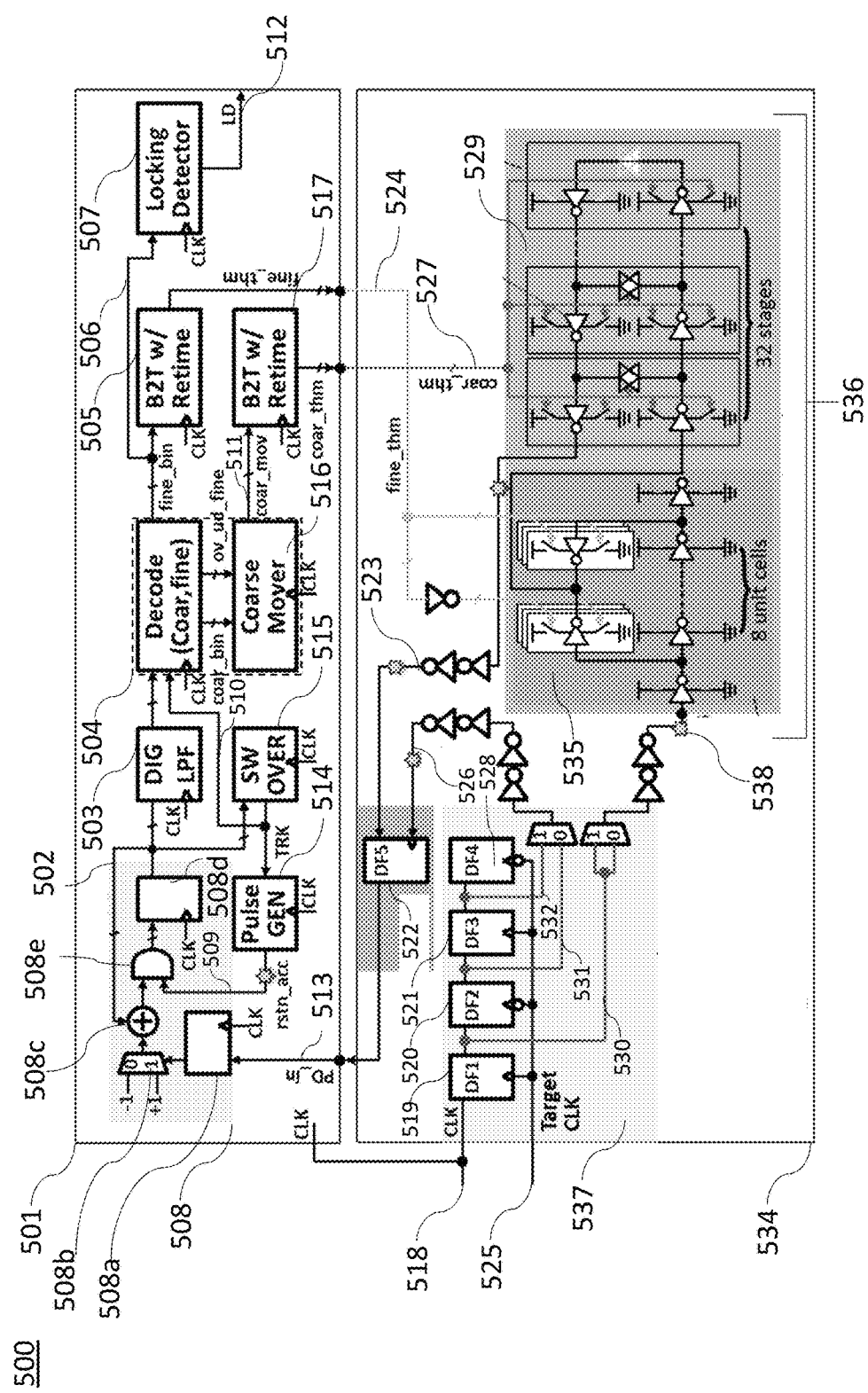
FIG. 5A is a schematic diagram of an example implementation of a DLL circuit, in accordance with some embodiments.

FIG. 5A is a schematic diagram of an example implementation of a DLL circuit, in accordance with some embodiments. In some embodiments, the DLL circuit of FIG. 5A is configured to generate a phase delay for delaying input periodic signal 518 by a target delay amount indicated by a period length of a target delay signal 525. In FIG. 5A, target delay generator 537 is configured to accept the input periodic signal 518 and the target delay signal 525 with a period length equal to the desired phase shift to be applied to a periodic signal with a frequency equivalent to that of the input periodic signal 518. The target delay generator 537 first samples the input periodic signal 518 by the frequency of the target delay signal 525 by sending the input periodic signal 518 through a first D flip flop 519, which accepts the target delay signal 525 as its clock value.

Figure 5B:
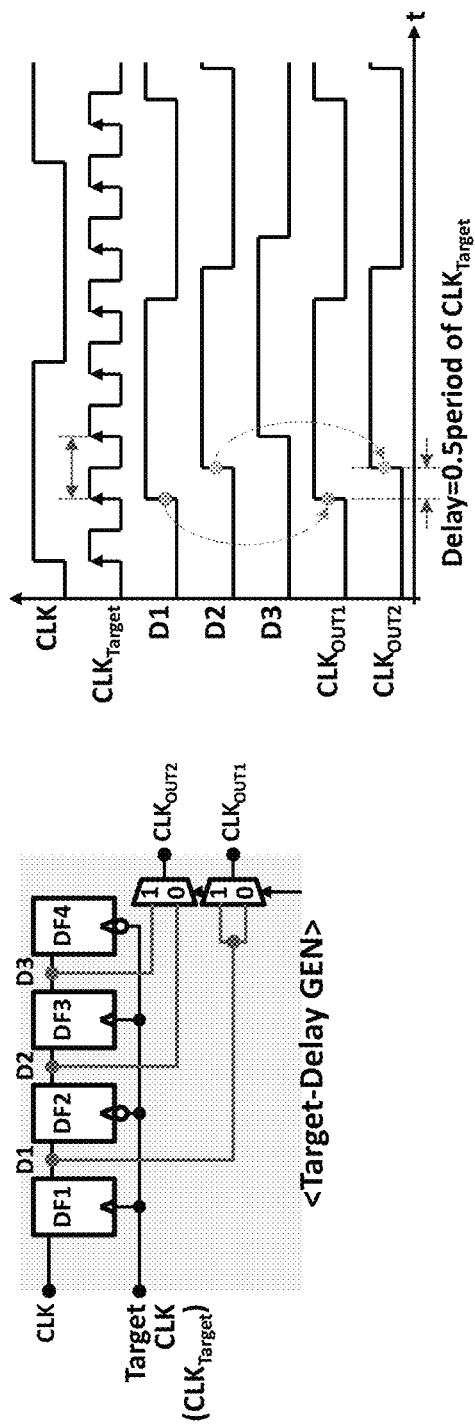
FIG. 5B is a timing diagram for signals used by a target delay generator, in accordance with some embodiments.

The first D flip flop 519 outputs a pre-delayed signal 530, which is equivalent to the input periodic signal 518 represented in the resolution of the target phase delay size, with its period being a whole number integer multiple of the target phase delay. A second D flip flop 520 accepts the pre-delayed signal 530 as an input and the target delay signal 525 as its clock, which produces a phase comparison signal 531 as an output. The target delay generator 537 outputs the pre-delayed signal 530 to be accepted as an input to a delay element 536 and outputs the phase comparison signal 531 to be accepted as an input for a phase detector 522. FIG. 5B is a timing diagram for signals used by the target delay generator 537, in accordance with some embodiments.

With reference again to FIG. 5A, in some embodiments, the phase detector 522 includes a single D flip flop, which is configured to accept an output signal 523 as its input and the phase comparison signal 531 as its clock. The phase comparison signal 531 is equivalent to the pre-delayed signal 538, but phase shifted exactly one target delay behind it by the second D flip flop 520. The output signal 523 is equivalent to the pre-delayed signal plus a delay applied to it by a delay element 536. Modifying the delay applied to the output periodic signal 523 by delay element 536 is used to bring the phases of the output periodic signal 523 to be equivalent in magnitude to the target delay. Therefore, in some embodiments, the D flip flop comprising phase detector 522 is configured to output a logic 1 signal to phase shift signal 513 while the phase of the phase comparison signal 531 lags behind the phase of the output periodic signal 523, indicating that the delay applied by the delay element 536 needs to be increased for the magnitude of the delay to match the target delay. Conversely, if the phase of the output periodic signal 523 lags behind the phase comparison signal 531, the D flip flop comprising the phase detector 522 outputs a logic 0 to phase shift signal 513, indicating that the delay applied by the delay element 536 needs to be decreased for the magnitude of the delay to match the target delay.

A phase circuit 508 acts as a phase accumulator by being configured to accept the phase shift signal 513 as an input once per cycle of a clock synced to the input periodic signal 518. The value of the phase shift signal 513 is read once per clock cycle by accepting it as an input to a D flip flop 508*a* with a clock synced to input periodic signal 518. The output of the D flip flop 508*a* acts as a control bit for a multiplexer 508*b*, which outputs a binary value of 1 when its control bit is a 1 and a binary −1 when the control bit is a 0. This binary value is accepted by a binary adder element 508*c*, which also receives delay size signal 502 as an input once per clock cycle by sending its output through a D flip flop 508*d* with a clock synced to the input periodic signal 518 before receiving delay size signal 502 back as an input. The value accumulated as delay size signal 502 is output by the phase circuit 508 and indicates a magnitude of phase delay to be applied by the phase delay element 536.

In some embodiments, the delay size signal is sent through a digital low pass filter 503 to mitigate noise in the signal before being sent to a decoder 504. The decoder 504 accepts delay size signal 502 as an input to convert the delay size signal 502 to a unary control word for controlling an amount of delay applied by delay element 536. In some embodiments of the circuit in which the delay element 536 comprises multiple modes of function, such as a coarse tuning part 529 and a fine tuning part 535, the decoder 504 has multiple modes of operation for the purpose of making either coarse delay changes or fine tuning delay adjustments applied to the output periodic signal 523 by the delay element 536. In some embodiments, the decoder is configured to receive a mode switching signal 510 as an input. While the mode switching signal 510 is set to its initial value of logic 0, the decoder operates in coarse mode, which causes the delay size signal to be ultimately converted into a unary coarse delay control word 527 by a coarse unary converter 517 for controlling the amount of coarse delay applied to output periodic signal 523 by the coarse tuning part 529 of the delay element 536. Before reaching the coarse unary converter 517, a coarse mover 516 is implemented, which ensures the continuity of a control signal being sent to the coarse tuning part 529 of delay element 536 by continuously outputting the last nonzero value output for coarse tuning 511 by the decoder 504 while it was in coarse mode.

In some embodiments, a mode switching circuit 515 is configured to receive the delay size signal 502, and upon receiving a drop in the value of delay size signal 502, outputting a logic 1 signal to mode switching signal 510, which was originally initialized to logic 0. A pulse generator 514 is configured to receive the mode switching signal 510 and output a phase accumulator reset signal 509, which is combined with the sum of the binary adder element 508c by a logic AND gate 508e before reaching D flip flop 508d, which resets the value of delay size signal 502 to 0 to begin accumulating a value for the delay to be applied to output signal 523 by fine tuning part 535 of delay element 536.

Upon receiving a logic 1 signal as input from mode switching signal 510, the decoder 504 switches from coarse tuning mode to fine tuning mode. The unary coarse control word 527 is locked at its current value so that the coarse delay being implemented is continued during and after fine tuning delay adjustments. The decoder 504 outputs the delay size signal to a fine unary converter 505, which outputs a unary fine delay control word 524 to control the amount of delay applied to output periodic signal 523 by the fine tuning part 535 of delay element 536.

In some embodiments, a locking detector 507 is configured to accept a binary delay control word 506 by the decoder 504 and a periodic input signal equivalent to input periodic signal 518. In some embodiments, the control word 506 corresponds to a delay control word for fine tuning adjustments. The locking detector 507 accepts control word 506 once every clock cycle and compares it to a set threshold value. If the control word 506 does not exceed the threshold value for a predetermined number of cycles, it outputs a logic 1 signal on lock detection signal 512, which was previously initialized to logic 0.

A delay element 536 is configured to accept the pre-delayed periodic signal 538 as an input. In some embodiments, the delay element 536 is comprised of a coarse tuning part 529 and a fine tuning part 535. The coarse tuning part 529 accepts the unary coarse delay control word 527, which controls an amount of coarse delay increments applied by delay element 536. The fine tuning part 535 accepts the unary fine delay control word 524 with the most significant half of the bits inverted to shift the initial default delay to 50% of the overall fine tuning delay capacity to allow the delay to be shifted in both directions as necessary. The pre-delayed periodic signal 538 is then fed through all delay elements activated by receiving a logic 1 bit from the portion of unary control code they receive in both the coarse tuning and fine tuning parts of the delay element 536 and outputting the output periodic signal 523.

In some embodiments, the delay element 536 has a unit cell structure configured to reduce delay variation between coarse-tuning block 529 and fine-tuning block 535 and also reduce the circuit complexity. The unit cell structure of the delay element 536 is implemented by a tri-state inverter with a controlled pin (EN) in some embodiments. In the example of FIG. 5A, the coarse-tuning block 529 is a 32-stage delay train controlled by a thermometer code 527. Each stage of the coarse-tuning block may be implemented by 2 unit cells and a transmission-gate. In some embodiments, the fine-tuning block 535 is implemented by a phase interpolator with the delay range using eight unit cells. The fine-tuning block includes thirty-two (32) steps to create finer resolution in some embodiments.

Figure 5C:
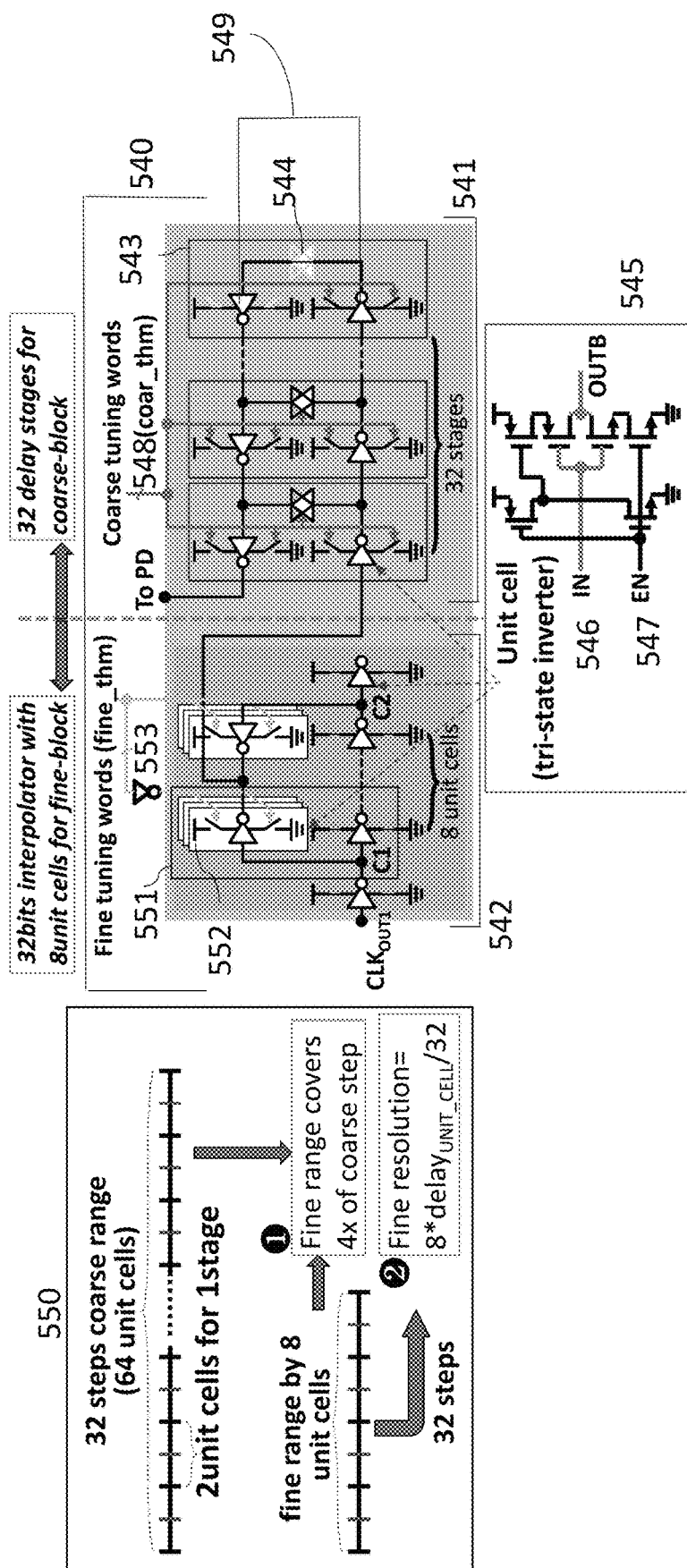
FIG. 5C is a schematic diagram of an example implementation of a timing element circuit, in accordance with some embodiments.

FIG. 5C depicts a delay element 540, in accordance with some embodiments.

In some embodiments, the delay element 540 has a coarse tuning part 541 and a fine tuning part 542. Both parts of the delay element 540 are configured with a unit cell structure. An example coarse unit cell is depicted by a coarse unit cell 543. The coarse unit cell 543 is implemented with two tri-state inverter unit cells 549 and a transmission gate 544. An example transistor-level schematic 545 of the tri-state inverter unit cell 549 is shown by schematic 545. In the example of FIG. 5C, the coarse tuning part 541 is a 32-stage delay train controlled by a thermometer code coarse tuning word 548. Each stage of the coarse-tuning block may be implemented as the coarse unit cell 543.

Each cell has an input periodic signal to be delayed 546 and an enable pin 547. The enable pin 547 is electrically coupled to a single bit of the thermometer code coarse unit cell 543. Each unit cell 543 has both of its tri-state inverter unit cells receiving the same bit from thermometer code coarse tuning word 548 and each unit cell 543 receives a different bit of thermometer code coarse tuning word 548 than the others as the enable signal of the enable pin 547. In this way, the thermometer code coarse tuning word 548 controls the number of coarse unit cells 543 active by receiving a logic 1 input to enable pin 547, or disconnects a number of unit cells 543 by setting the enable pin to logic low, resulting in the unit cells 549 having a high impedance and disconnecting a portion of delay from the coarse tuning part 541.

The fine tuning part 542 is implemented with unit cells containing a phase interpolator in some embodiments with a delay range of eight (8) unit cells 551 and thirty-two (32) steps for fine resolution. As depicted in chart 550, each of the eight (8) unit cells is implemented with four steps for fine resolution. Each of the eight (8) unit cells 551 achieves this fine resolution by having an array of tri-state inverter unit cells 552, each of which turning on or off a step of delay according to a thermometer code fine tuning word 553 it receives on enable pin 547 in the same manner as is done with the coarse tuning part 541.

Figure 6:
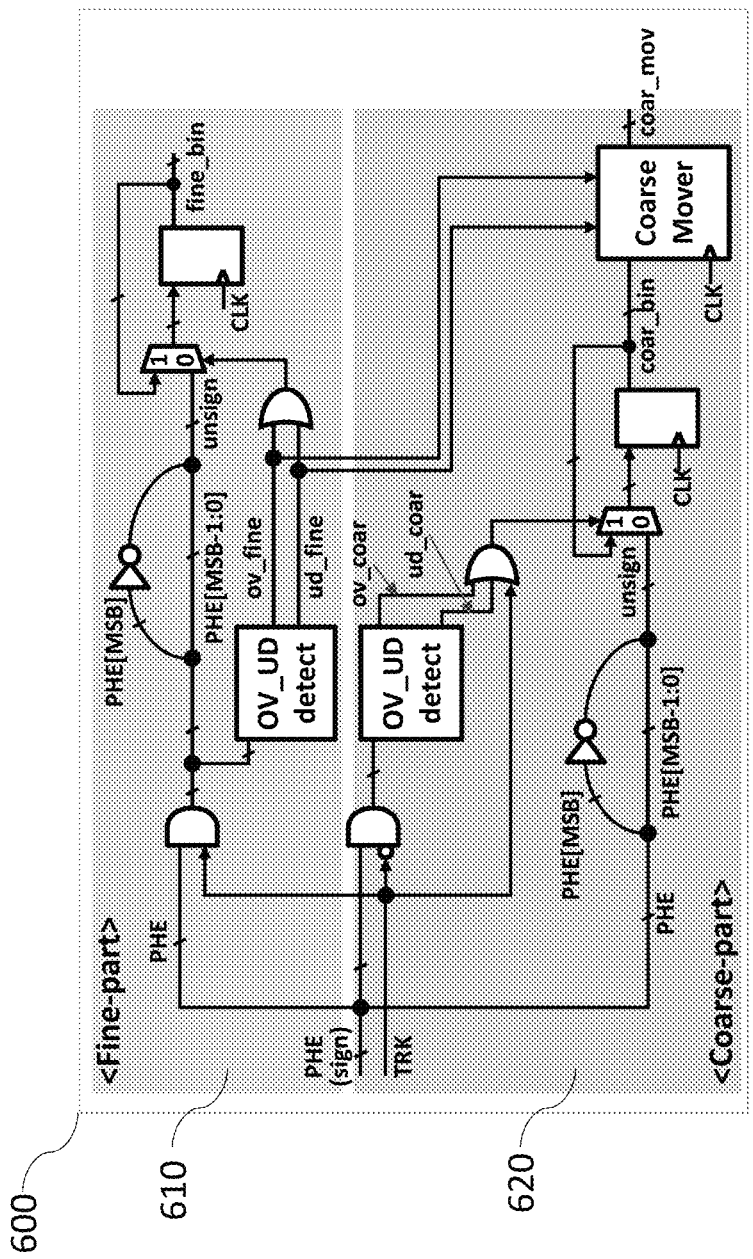
FIG. 6 depicts details of a decoder having a fine tuning part and a coarse tuning part, in accordance with some embodiments.

FIG. 6 depicts details of a decoder 600 having a fine tuning part 610 and a coarse tuning part 620, in accordance with some embodiments. As described herein, the decoder 600 converts phase information of a digital filter to operational tuning words that are used by a delay element. Fine tuning words generated by the fine tuning part 610 are fixed at a middle value when the coarse tuning part 620 is activated. Likewise, coarse tuning words generated by the coarse tuning part 620 are locked to a value when fine tuning part 610 is activated.

As shown in FIG. 6, embodiments of the decoder 600 include overflow/underflow detectors (labeled "OV_UD detect"), which are embedded in both the fine tuning part 610 and the coarse tuning part 620. When an overflow/underflow of coarse and fine tuning words is triggered, the tuning words of both the fine tuning part 610 and the coarse tuning part 620 are locked at the previous value. In addition to the overflow/underflow detectors, embodiments of the fine tuning part 610 and coarse tuning part 620 also include the logic components and coarse mover for providing fine and coarse decoding of the received PHE and TRK signals. These components and the coarse mover are described in further detail in U.S. Pat. No. 10,439,794, which is incorporated herein by reference in its entirety.

Figure 7A:
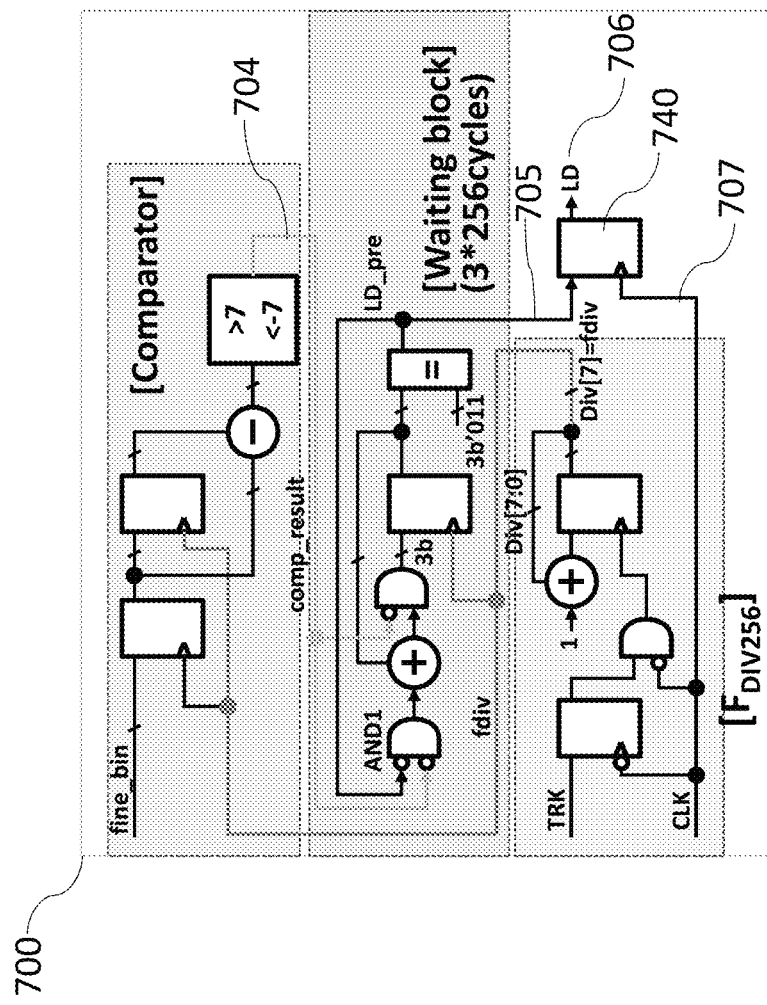
FIGS. 7A and 7B depict details of a locking detector, in accordance with some embodiments.
Figure 7B:
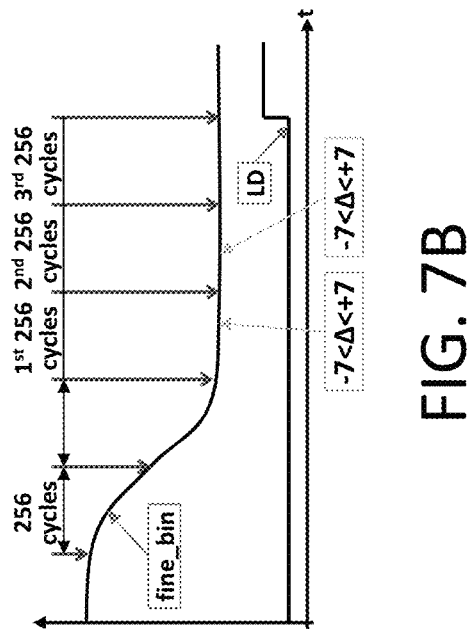

FIGS. 7A and 7B depict details of a locking detector 700, in accordance with some embodiments. As described above, the locking detector 700 is configured to accept a binary delay control word output by a decoder and a periodic input signal 707 equivalent to a periodic input signal. The locking detector 700 accepts the control word once every clock cycle and compares it to a set threshold value, and if the control word does not exceed the threshold value for a predetermined number of cycles, the locking detector 700 outputs a logic 1 signal on a lock detection signal, which was previously initialized to logic 0.

Additionally, as shown in FIGS. 7A and 7B, the locking detector 700 samples fine tuning words (fine_bin) every 256 reference clock cycles after the signal TRK goes high. The locking detector 700 compares the difference of fine_bin to check whether the difference is within +7 codes. If the compared results 704 are within this criteria, the 3-bit counter is triggered to accumulate value 705. The LD signal 706 outputted by a flip flop 740 goes high until the digits of the 3-bit counter is 3, which indicates that the DLL circuit is locking. In some embodiments, the overall waiting period is 768 reference cycles, as shown in FIG. 7B.

Figure 8:
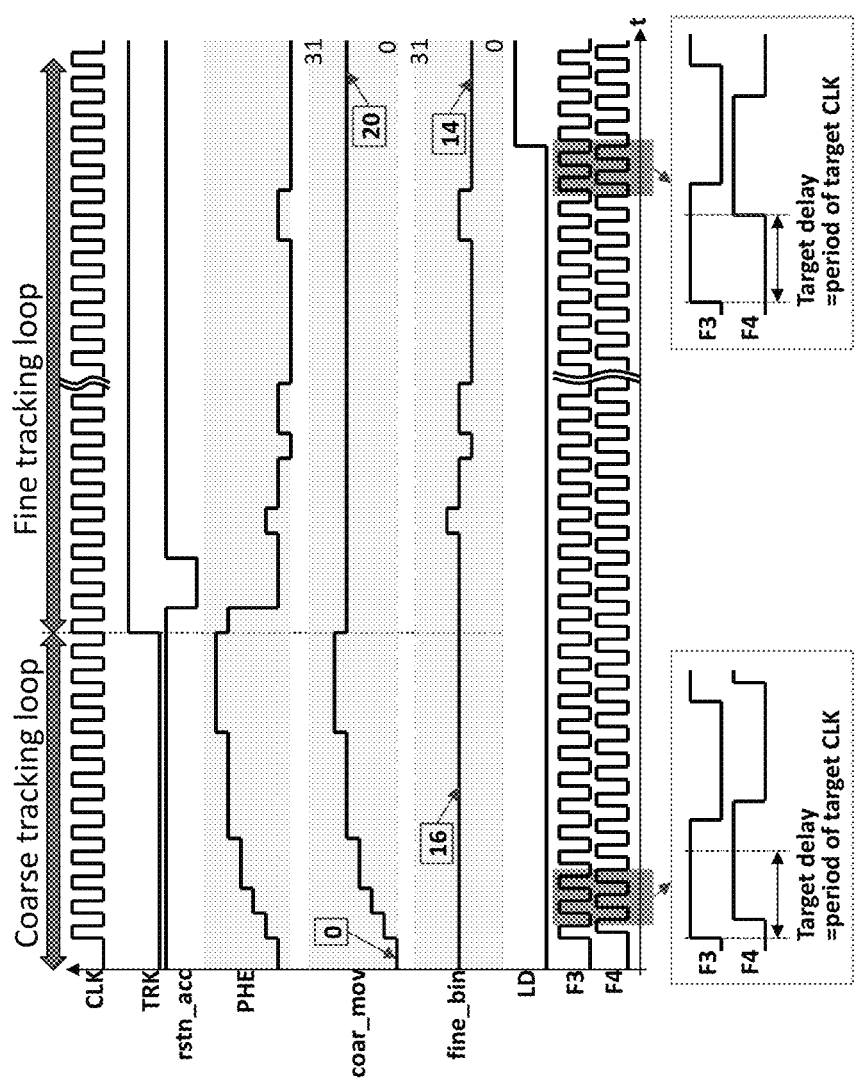
FIG. 8 depicts a timing diagram of a DLL circuit implemented in accordance with some embodiments of the present disclosure.

FIG. 8 depicts a timing diagram of a DLL circuit implemented in accordance with some embodiments of the present disclosure. As shown in this figure, when the DLL circuit is in an initial condition, the state of coarse and fine tuning words is 0 and middle of 16, respectively. The clock of D flip flop 1 (e.g., DF1) is an input clock, and the clock of D flip flop 2 (e.g., DF2) is a delay clock. At the beginning, coarse tuning words increase to follow a target delay, and fine tuning words are locked at the middle value. The switchover of coarse to fine tuning is determined by the SWOVER block, as described herein. The SWOVER block is described in further detail in U.S. Pat. No. 10,644,869, which is incorporated herein by reference in its entirety.

Figure 9:
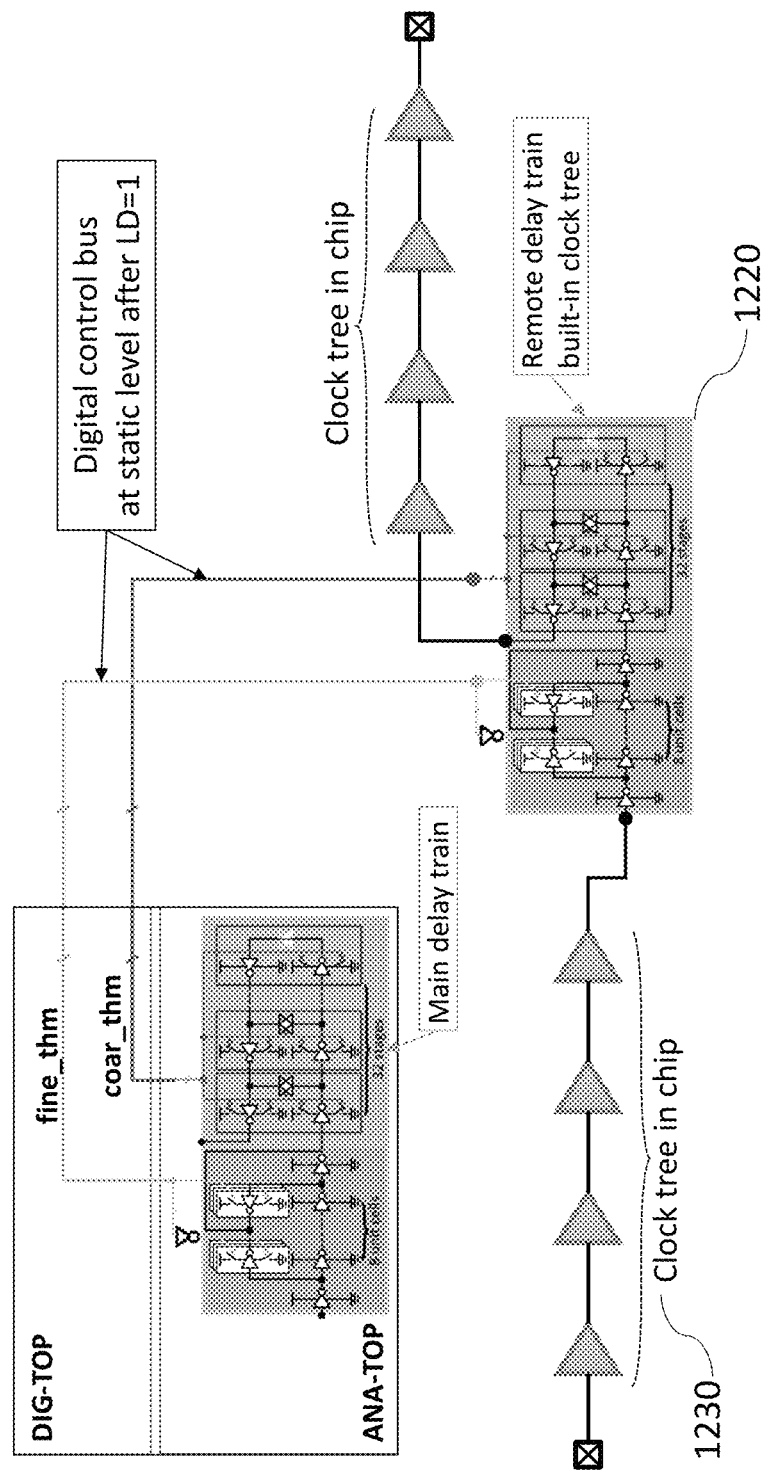
FIG. 9 depicts the use of a clock tree to shift the phase of a strobe clock, in accordance with some embodiments.

The approaches of the instant disclosure can be used in a clock tree to shift the phase of a strobe clock (e.g., sampling clock) to the center of data. FIG. 9 shows an example of this. The delay-train of the analog-top portion is controlled by digital signals and thus this block can be duplicated to be a remote delay train 1220 for embedding within a clock tree of a chip. A benefit of this architecture is that the remote delay train 1220 has compact dimensions and can be applied in the multiple clock trees 1230. More generally, the approaches of the instant disclosure can be used to replace the conventional analog DLL circuits and thereby remove variation due to current and device mismatch, as described above.

Figure 10:
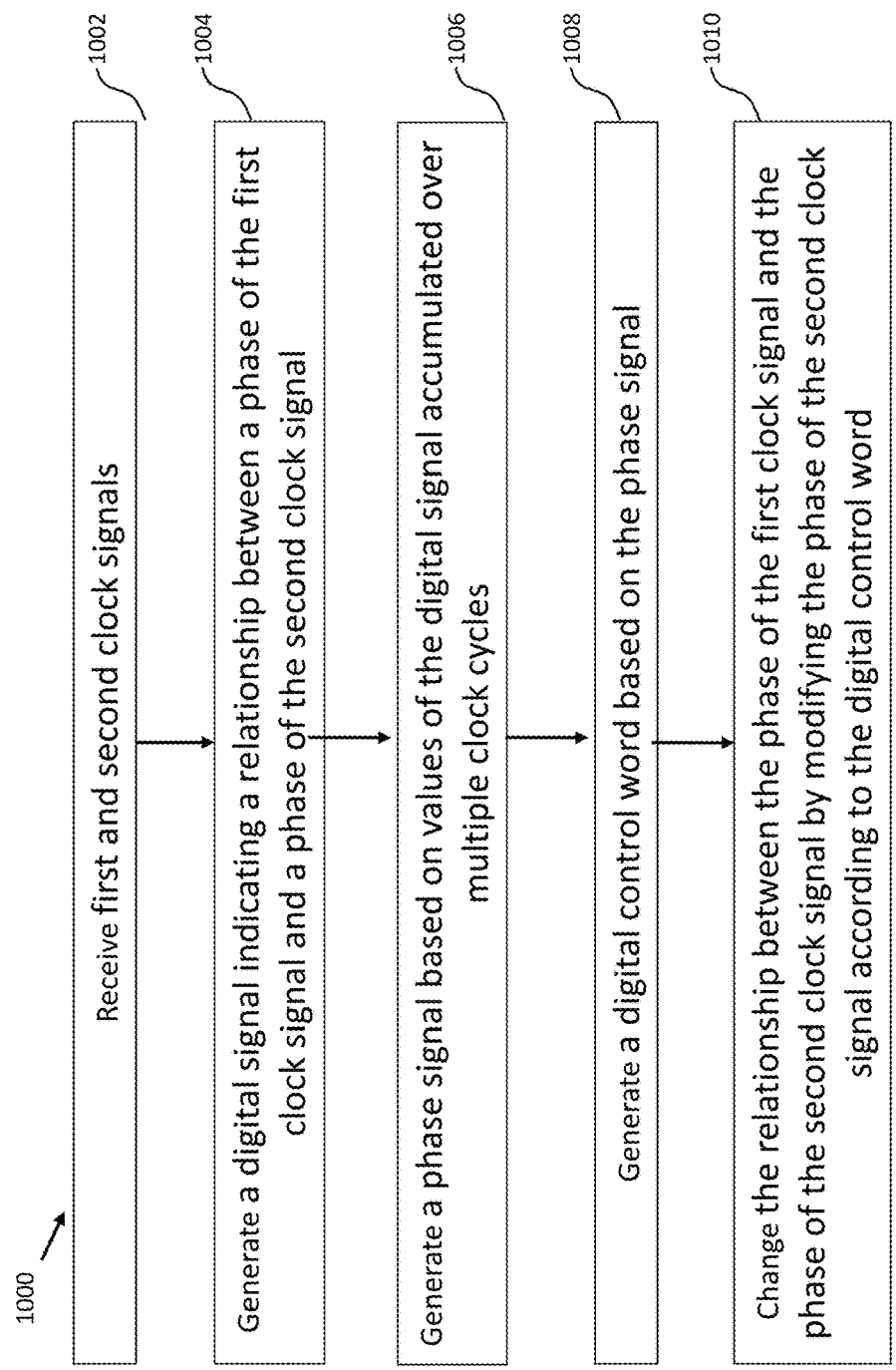
FIG. 10 depicts operations of an example method in accordance with some embodiments.

FIG. 10 depicts operations of an example method 1000, in accordance with some embodiments. FIG. 10 is described with reference to FIG. 1 above for ease of understanding. But the process of FIG. 10 is applicable to other circuits as well. At 1002, first and second clock signals (e.g., first clock signal 105, second clock signal 103) are received. At 1004, a digital signal (e.g., digital signal 104) indicating a relationship between a phase of the first clock signal and a phase of the second clock signal is generated. In the example of FIG. 1, the first and second clock signals are received by the phase detector 130, and the phase detector 130 generates the digital signal. At 1006, a phase signal (e.g., phase signal 101) is generated based on values of the digital signal accumulated over multiple clock cycles. In the example of FIG. 1, the phase signal is generated by the phase circuit 100, which may be implemented using a phase accumulator circuit. At 1008, a digital control word (e.g., digital control word 102) is generated based on the phase signal. In the example of FIG. 1, the digital control word is generated by the decoder 110. At 1010, the relationship between the phase of the first clock signal and the phase of the second clock signal is changed by modifying the phase of the second clock signal according to the digital control word. In the example of FIG. 1, the relationship is changed by the delay element 120.

The present disclosure is directed to digital delay lock circuits and methods for operating digital delay lock circuits. An example circuit includes a phase detector configured to (i) receive first and second clock signals, and (ii) generate a digital signal indicating a relationship between a phase of the first clock signal and a phase of the second clock signal. A phase accumulator circuit is configured to receive the digital signal and generate a phase signal based on values of the digital signal over multiple clock cycles. A decoder is configured to receive the phase signal and generate a digital control word based on the phase signal. A delay element is configured to receive the digital control word and change the relationship between the phase of the first clock signal and the phase of the second clock signal by modifying the phase of the second clock signal according to the digital control word.

Another example circuit includes a phase detector configured to receive first and second clock signals and generate a digital signal indicating a relationship between a phase of the first clock signal and a phase of the second clock signal. The example circuit further includes a digital control block configured to receive the digital signal and generate a digital control word based on values of the digital signal over multiple clock cycles. A delay element is configured to (i) receive the digital control word, and (ii) change the relationship between the phase of the first clock signal and the phase of the second clock signal by modifying the phase of the second clock signal according to the digital control word.

In an example method for operating a delay lock loop circuit, first and second clock signals are received. A digital signal indicating a relationship between a phase of the first clock signal and a phase of the second clock signal is generated. A phase signal is generated based on values of the digital signal accumulated over multiple clock cycles. A digital control word is generated based on the phase signal. The relationship between the phase of the first clock signal and the phase of the second clock signal is changed by modifying the phase of the second clock signal according to the digital control word.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a decoder; and
   a delay element including one or more tuning elements, wherein each of the one or more tuning elements has a unique programmable delay increment, the decoder includes one or more decoder elements, and each of the one or more decoder elements is configured to generate a control word corresponding to one of the one or more tuning elements.

2. The circuit of claim 1, further comprising a switch mode element configured to receive a phase signal and to switch from modifying an amount of delay applied by a coarse tuning element to modifying an amount of delay applied by a fine tuning element upon the phase signal indicating that a difference between a first clock signal and a second clock signal is smaller than an amount of delay change that can be applied by the coarse tuning element.

3. The circuit of claim 2, further comprising a delay generator configured to receive (i) an input periodic signal having a frequency equal to a desired frequency for the first and second clock signals, and (ii) a target phase periodic signal having a period equal to a target phase delay between the first and second clock signals.

4. The circuit of claim 3, wherein the delay generator is further configured to generate (i) a pre-shifted periodic signal, the pre-shifted periodic signal being the input periodic signal sampled by the target phase periodic signal, and (ii) a phase comparison signal, the phase comparison signal being the pre-shifted periodic signal sampled by the target phase periodic signal.

5. The circuit of claim 1, further comprising a delay generator configured to receive a first clock signal and a target delay signal representing a target phase delay change to the first clock signal and to generate a second clock signal by sampling the first clock signal at a frequency inversely proportional to the target phase delay change.

6. The circuit of claim 5, wherein the target delay signal is a periodic signal with a period indicating the target phase delay change.

7. The circuit of claim 1, further comprising a locking detector configured to receive a digital delay control word and a reference clock and to generate a phase lock signal after the digital delay control word remains under a threshold value for a predefined number of clock cycles.

8. The circuit of claim 1, wherein the decoder is configured to receive a phase signal and to generate a digital control word and the delay element is configured to receive the digital control word and to change a relationship between first and second clock signals.

9. A circuit comprising:
a digital control block configured to receive a digital signal indicating a relationship between a first clock signal and a second clock signal and to generate a digital control word; and
a delay element configured to receive the digital control word and to change the relationship between the first clock signal and the second clock signal based on the digital control word.

10. The circuit of claim 9, wherein the delay element comprises a coarse tuning element and a fine tuning element and the fine tuning element has a shorter programmable delay increment than the coarse tuning element.

11. The circuit of claim 10, wherein the digital control block includes a coarse decoder element and a fine decoder element, the coarse decoder element is configured to generate a coarse control word to control the coarse tuning element, and the fine decoder element is configured to generate a fine control word to control the fine tuning element.

12. The circuit of claim 10, further comprising a switch mode element configured to switch from modifying an amount of delay applied by the coarse tuning element to modifying an amount of delay applied by the fine tuning element when a difference between the first clock signal and the second clock signal is smaller than an amount of delay change that can be applied by the coarse tuning element.

13. The circuit of claim 9, further comprising a delay generator configured to generate (i) a pre-shifted periodic signal, the pre-shifted periodic signal being an input periodic signal sampled by the target phase periodic signal, and (ii) a phase comparison signal, the phase comparison signal being the pre-shifted periodic signal sampled by the target phase periodic signal.

14. The circuit of claim 9, further comprising a delay generator configured to receive the first clock signal and a target delay signal representing a target phase delay change to the first clock signal, the delay generator being configured to generate the second clock signal by sampling the first clock signal at a frequency inversely proportional to the target phase delay change.

15. The circuit of claim 14, wherein the target delay signal is a periodic signal with a period indicating the target phase delay change.

16. The circuit of claim 9, further comprising a locking detector configured to (i) receive the digital control word and a reference clock, and (ii) generate a phase lock signal after the digital control word remains under a threshold value for a predefined number of clock cycles.

17. A method comprising:
changing a relationship between a first clock signal and a second clock signal according to a digital control word; and
receiving the digital control word at a locking detector, wherein the locking detector generates a phase lock signal after the digital control word remains under a threshold value for a predefined number of clock cycles.

18. The method of claim 17, wherein the second clock signal is modified by delaying a pre-shifted periodic signal by an amount indicated by the digital control word, the pre-shifted periodic signal having a frequency equal to the desired frequency of the second clock signal.

19. The method of claim 17, further comprising:
sampling the second clock signal by the first clock signal to generate a digital signal;
generating a phase signal based on the digital signal; and
generating the digital control word based on the phase signal.

20. The method of claim 19, wherein the digital control word is generated by decoding the phase signal, the phase signal being incremented when the digital signal is high or decremented when the digital signal is low once per clock cycle.

* * * * *